(12) United States Patent
Payne et al.

(10) Patent No.: US 8,429,482 B1
(45) Date of Patent: Apr. 23, 2013

(54) MULTI-STAGE FORWARD ERROR CORRECTION DECODING

(75) Inventors: Robert E. Payne, Edinburgh (GB); Graham Johnston, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/427,792

(22) Filed: Mar. 22, 2012

(51) Int. Cl.
*H03M 13/00* (2006.01)
*H03M 13/03* (2006.01)
*H04L 1/18* (2006.01)

(52) U.S. Cl.
USPC .......................... 714/751; 714/752; 714/786

(58) Field of Classification Search .................. None
See application file for complete search history.

(56) References Cited

U.S. PATENT DOCUMENTS

| 5,822,324 | A * | 10/1998 | Kostresti et al. | 370/487 |
|---|---|---|---|---|
| 2006/0274691 | A1* | 12/2006 | Naguib et al. | 370/330 |
| 2007/0180349 | A1* | 8/2007 | Jacobsen | 714/776 |
| 2009/0185521 | A1* | 7/2009 | Li et al. | 370/315 |

OTHER PUBLICATIONS

Ishfaq Ahmad, Yong He, Ming L. Liou Video Compression with parallel Processing 2002, pp. 1-40.*

* cited by examiner

*Primary Examiner* — Guerrier Merant
(74) *Attorney, Agent, or Firm* — LeRoy D. Maunu

(57) ABSTRACT

In one embodiment, a multi-stage decoder circuit is provided. Each stage of the decoder circuit is configured to perform one or more decoding iterations and produce an error mask indicating errors detected in the decoding stage. A compression circuit is coupled to one or more of the decoder stages and is configured to generate, for each of one or more of the plurality of decoder stages, a respective compressed error mask from the error mask produced by the decoder stage. A buffer circuit is coupled to the compression circuit and is configured to buffer the compressed error masks. A decompression circuit is coupled to the buffer circuit and is configured to decompress each of the compressed error masks. A combination circuit is coupled to the decompression circuit and is configured to combine the decompressed error masks into a single error mask.

20 Claims, 6 Drawing Sheets

MULTI-STAGE FORWARD ERROR CORRECTION DECODING

FIELD OF THE INVENTION

One or more embodiments generally relate to forward error correction of data blocks.

BACKGROUND

Some transport protocols implement forward error correction (FEC) to recover dropped or corrupted data packets without requiring retransmission. FEC adds metadata redundancy to a data packet by encoding the data packet prior to transmission. The added redundancy is used to detect and recover missing or corrupt portions of the received data. Some example error correction codes include Hamming, Bose-Chaudhuri-Hochquenghem (BCH), Reed-Solomon (RS), Viterbi, trellis, etc.

More recently, turbo coding schemes have been developed that utilize a combination of two or more FEC encoding schemes to provide greater bit-error rate correction capability and increase throughput. For example, RS encoding is often combined with another encoding. Turbo codes improve data correction by using combined probability data to reconcile differences between data values predicted for the two FEC schemes. For example, a decoder for each scheme may be used to generate prospective corrected values (with derived likelihoods) for a set of data bits. The corrected values of the two schemes are compared, and if they differ, the decoders exchange the probability information calculated for each bit of the data. Each decoder incorporates the information from the other decoder to generate new corrected values, which are again compared. This iterative decoding process is repeated, over a number of cycles, until the two decoders produce the same corrected data values. Due to its high performance, turbo-coding schemes are expected to remain in widespread use for FEC encoding and decoding.

To increase throughput for streaming applications, most FEC decoders perform the iterative decoding process using a number of decoder stages arranged in a pipeline. Each stage in the pipeline implements one iteration of the decoding process. However, the entire decoding pipeline typically has a large latency that poses a challenge to the implementation of some FEC features. For example, in FEC decoding, error statistics are important for evaluation of and adjustment of transmission channel characteristics to improve bandwidth and reduce errors. In some previous approaches, located errors are counted in each stage as the data block is processed. However, this approach is not accurate because a bit may be toggled several times in the iterative decoding process. For example, bits may be corrected at one stage, and reverted at the next stage.

Some other approaches provide accurate error statistics by storing uncorrected data until the final decode stage has completed. The corrected data is XOR'ed with the buffered uncorrected data to generate an error mask indicating the location where the error occurred in the data block. For example, an error mask may use a '1' to indicate an error occurred in that bit location and a '0' to indicate no error. The error mask is used to generate statistics for the whole decode chain such as a number of bits corrected, number of corrected 0 bits, number of corrected 1 bits, etc.

SUMMARY

In one embodiment, a multi-stage decoder circuit is provided. Each stage in the decoder circuit is configured to perform one or more decoding iterations and produce an error mask indicating each error detected in input data by the one or more decoding iterations. A compression circuit is coupled to one or more of the decoder stages and is configured to generate, for each of the one or more decoder stages, a respective compressed error mask from the error mask produced by the decoder stage. A buffer circuit is coupled to the compression circuit and is configured to buffer the compressed error masks generated by the compression circuit. A decompression circuit is coupled to the buffer circuit and is configured to decompress each of the compressed error masks into the error mask produced by the corresponding decoder stage. A combination circuit is coupled to the decompression circuit and is configured to combine the error masks generated by the decompression circuit into a single error mask.

In another embodiment, a method for multi-stage FEC decoding is provided. An FEC coded datablock is decoded using a plurality of decoder stages, which includes N stages arranged in a pipeline circuit. Each stage of the N decoder stages is configured to perform one or more decoding iterations and generate an error mask that indicates each error found in performing the one or more iterations. For each error mask generated by decoder stages 1 through M, wherein 1<M<N the error mask is compressed into a compressed error mask and buffered. The buffered compressed error mask is decompressed into a decompressed error mask equal to the error mask. The decompressed error masks and error mask generated by decoder stages M+1 through N are combined into a single error mask.

In yet another embodiment a multi-stage decoder circuit is provided. The multi-stage decoder includes a plurality of decoder stages. Each decoder state is configured to perform one or more decoding iterations and produce an error mask indicating each error detected in input data in the decoder stage. A compression circuit is coupled to two or more of the plurality of decoder stages and is configured to generate, a respective compressed error mask from the error mask produced by each of the two or more decoder stages. A merge circuit is configured to combine at least two of the two or more compressed error masks to produce a merged error mask. A decompression circuit is coupled to the merge circuit and is configured to decompress the merged error mask to produce a decompressed error mask.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Buffering of data blocks in many multi-stage FEC decoders may require a large amount of memory. One or more embodiments reduce memory required for generating error statistics by compressing error location data from each decoder stage and buffering the compressed error location data.

In one embodiment, a decoder is implemented using multiple decoder stages arranged in a pipeline. In each decoder stage, errors detected in an input data block are logged as they are detected and corrected. In each stage, the logged data is used to generate a respective error mask, which indicates the location of the errors in the data block. When the decoding process is completed for a data block, the error masks generated by the decoder stages are combined together to produce a complete error mask for the multi-stage FEC decoder. Rather than buffer full size error masks from the decoder stages to preserve the locations of the errors, one or more embodiments compress error mask data and buffer the compressed data while the remaining stages of the decoding process complete decoding the data block. Compressed data output from the buffer is decompressed with a decompression circuit to retrieve the original error masks, and the decompressed data are then combined to produce an error mask that indicates errors detected throughout the entire decoding process.

Figure 1:
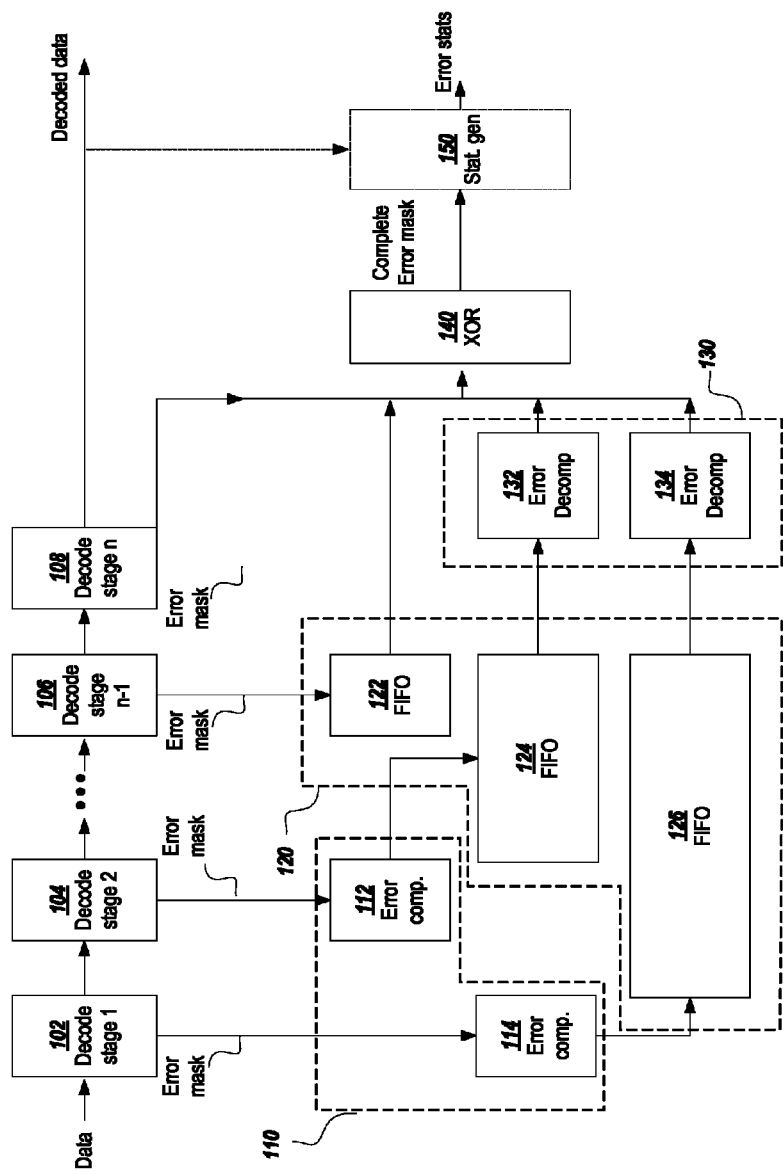
FIG. 1 shows a block diagram of a multi-stage FEC decoder configured in accordance with one or more embodiments.

FIG. 1 shows a block diagram of a multi-stage FEC decoder configured in accordance with one or more embodiments. The FEC decoder in this example includes N decoder stages (e.g., 102, 104, 106, and 108) connected in pipeline. As indicated above, each of the N decoder stages is configured to generate an error mask indicating the location of each error corrected in the decoder stage. The error masks are then compressed by a compression circuit 110 and stored in a buffer circuit 120 in the compressed format while the data block is being processed in the remaining decoder stages. At the output of the buffer circuit 120, a decompression circuit 130 reproduces the original error masks from the buffered compressed error masks. The error masks of the different stages are combined by a combination circuit 140 to produce a single error mask indicating the location of each error for the complete decoding of the data block. In this example, combination of the error masks is performed using XOR operations.

To illustrate the different hardware requirements for processing error masks of different decoder stages, the buffer circuit 120 is illustrated with individual first-in-first-out (FIFO) sub-circuits 122, 124, and 126 for processing the error packet of respective decoder stages 106, 104, and 102. Compression circuit 110 includes sub-circuits 112 and 114, and decompression circuit 130 includes sub-circuits 132 and 134, for processing error masks from decoder stages 104 and 102.

In some embodiments, error masks may not be compressed for some latter decoder stages where the reduction in buffer memory may not offset the extra circuitry necessary for data compression and decompression. The memory reduction achieved by compression of the error mask depends on the stage of the pipeline in which the error mask is generated. For example, the error mask generated in decoder stage 1 (102) needs to be buffered for the remaining N−1 stages, whereas the error mask generated in decoder stage 2 (104) only needs to be buffered for N−2 stages. Accordingly, a larger amount of memory is required to implement a FIFO 126 to buffer the stage 1 error masks than to implement a FIFO 124 to buffer the stage 2 error masks. Accordingly, some embodiments may not compress or buffer error masks generated by later decoder stages in the pipeline.

As one example, the error mask generated by the final decode stage (N) may be used immediately, and thus does not need to be buffered. As another example, the error mask from the penultimate stage (N−1 stage) may be buffered in FIFO 122 of buffer circuit 120 but not compressed. The completed error mask and the corrected data block may be used externally or internally to generate error statistics such as the number and direction (i.e. 0→1 or 1→0) of errors. For example, the generated error statistics may indicate a number of errors in which the correct value of the bits in error was 1 and a number of errors in which the correct value of the bits in error was 0. In some embodiments, the complete error mask may be output in parallel with the corrected data block for external error statistic generation. In some other embodiments, the decoder may include a statistics generation circuit 150 that determines various error statistics from the error location data in the error mask and the values contained in the corrected data block.

Figure 2:
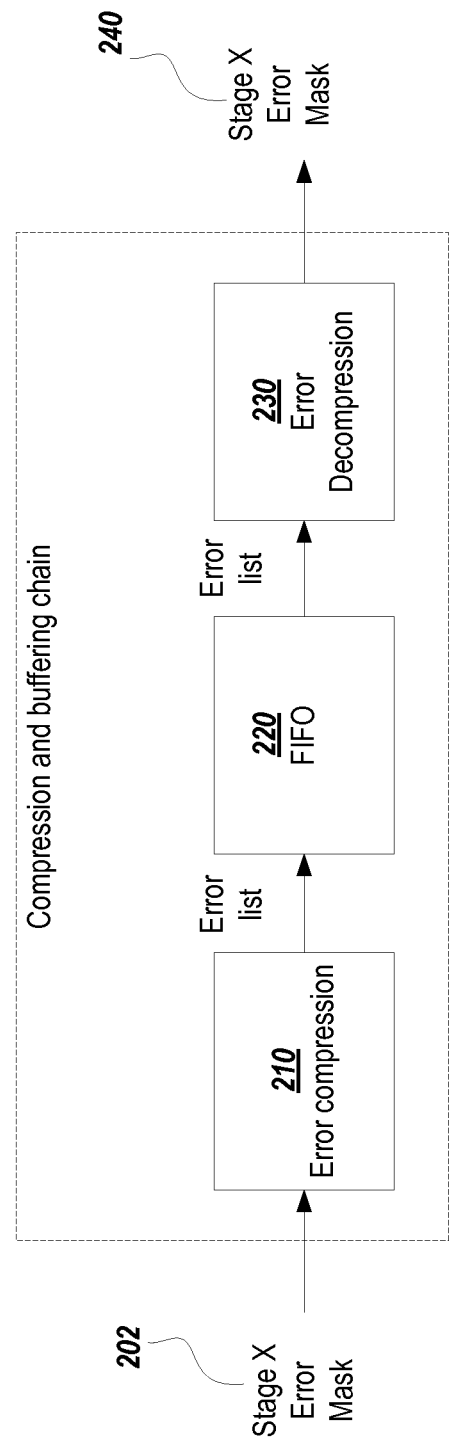
FIG. 2 illustrates dataflow of an error mask in the compression and buffering process chain in accordance with one or more embodiments.

FIG. 2 illustrates dataflow of an error mask in the compression and buffering process chain in accordance with one or more embodiments. The compression and buffering process chain is shown for one decoder stage X in a pipeline of N decoder stages. An error mask 202 generated by decoder stage X is input to a compression circuit 210, which generates a compressed version of the error mask. The compressed error mask is input to a FIFO buffer 220. The FIFO buffer buffers the compressed error mask while the corresponding data block is being processed by other decoder stages in the pipeline. For example, for a pipeline of N stages, a mask corresponding to stage X is buffered for the remaining N-X stages.

The size of FIFO buffer 220 that is required to buffer the error mask for the remaining stages depends on the frequency that errors are expected to be encountered in each decoding stage. As explained with reference to FIG. 3, below, error masks that do not indicate an error do not affect the combined error mask and are not required to be buffered. Therefore, the FIFO buffer 220 should be sufficiently sized to buffer the maximum number of error masks that are expected to indicate errors in a series of N decoded data blocks. The error rate may depend on the particular application and transmission characteristics. It is understood that the buffer size may be configured to handle the worst case scenario (i.e, buffer having depth N-X) or may be reduced in size to handle the statistically expected worst case as desired for a particular application.

As the corresponding data block is being decoded in the last stage of the multi-stage decoder, the compressed error mask is output from the buffer 220 and decompressed by decompression circuit 230 to generate an error mask 240 that is equivalent to the original error mask 202.

Figure 3:
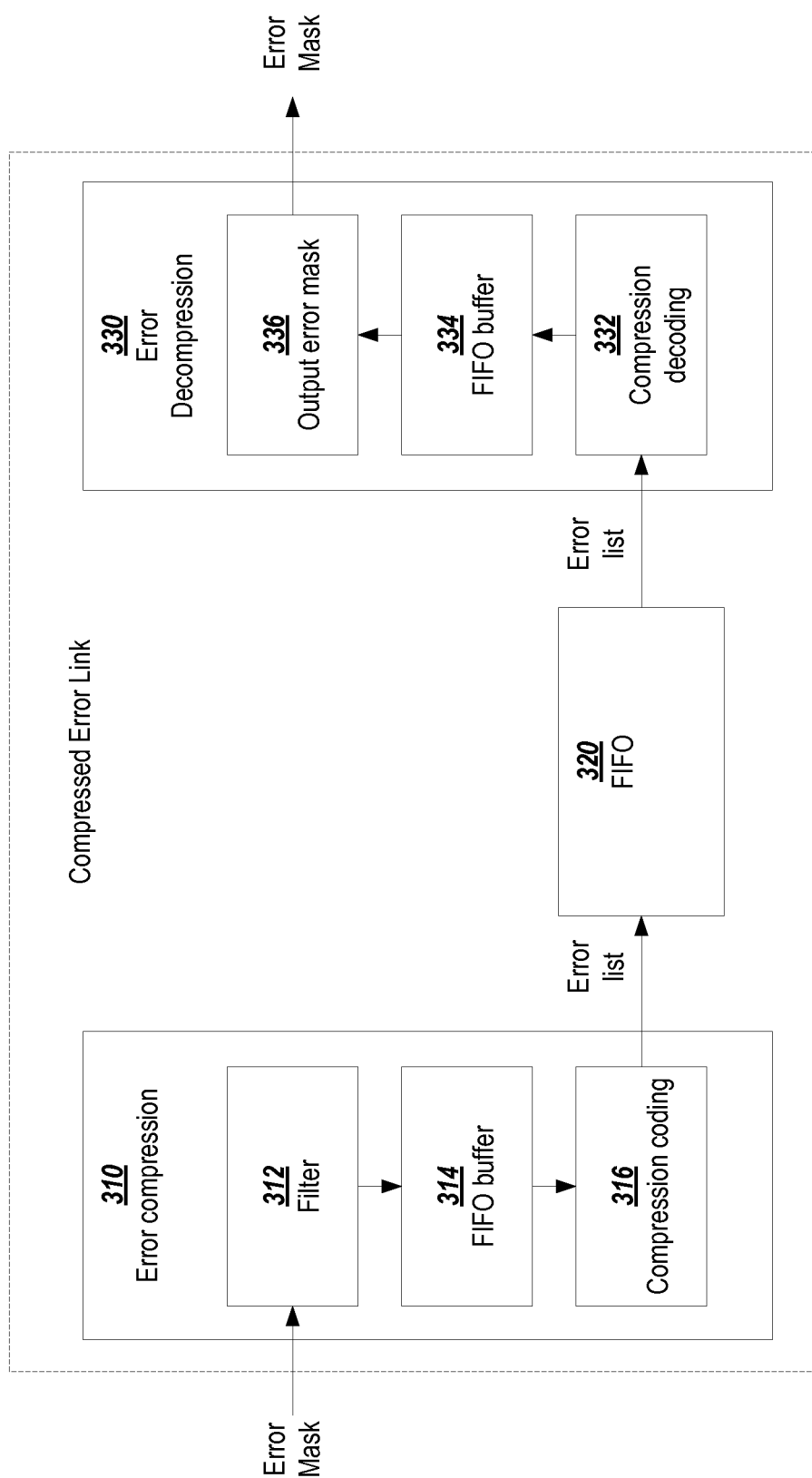
FIG. 3 illustrates data flow in the compression and decompression processing of an error mask in accordance with one or more embodiments.

FIG. 3 illustrates dataflow in the compression and decompression processing of an error mask in accordance with one or more embodiments. Error compression is performed by circuit block 310. In this example, error masks are examined by filter circuit block 312 to determine and filter out error masks that do not indicate any errors, as these masks will not affect the complete mask generated at the end of the decoding process. This filtering prevents unnecessary compression and buffering of error masks that do not indicate any errors. Non-zero error masks (i.e., error masks indicating errors) are written into a FIFO buffer 314, together with an index to the location of each error in the data block. The error masks are coded into a compressed data format at circuit block 316. The compressed error mask data is buffered in FIFO buffer 320 as described above.

The compression coding performed by circuit block 316 may be performed according to a number of different compression formats. As one example, error data may be compressed by storing the indices of the rows and columns of errors indicated by the error mask. Depending on the implementation, the indices may point to particular bits in error or may point to sub-sections of the error mask containing bit errors. For example, in one implementation, the indexing of errors may be performed to point to the start of a nibble (i.e., 4-bit group) containing the bit in error. Table 1 shows an example index-based compression format that may be used in accordance with one or more embodiments.

TABLE 1

| Error List Format | Bits | Description |
| --- | --- | --- |
| Word-index | 10 | Range 0-1023 words |
| Nibble-index | 3 | Range 0-7, where the word size is 32-bits wide |
| Nibble mask | 4 | Error mask for nibble |
| End of word group | 1 | If no error at end of word-group then this is inserted with nibble mask set to zero |
| Total | 18 | |

While example embodiments are primarily described with reference to index based compression formats, it is understood, that other compression formats or protocols may be used as well.

The reverse process occurs during the decompression stage. Compressed error masks are retrieved from FIFO buffer 320, so the decompressed error masks are available to be combined when the decoding process is complete. In some embodiments, timing of the retrieval of error masks from FIFO buffer 320 and decompressing of the compressed error mask may be synchronized with the flow of the multistage pipeline. In some other embodiments, the timing may be controlled by a logic circuit. When the compressed error mask data is retrieved from the FIFO buffer 320, it is decompressed by circuit block 330. In the decompression process, the original error mask is recreated at circuit block 332 by decompression coding the error and index data contained in the compressed error format. This is the reverse of the compression coding process performed at circuit block 316. The recreated error mask is stored in FIFO 334 until the error mask is output at block 336 to be combined with other error masks corresponding to the same data block.

While FIGS. 2 and 3 are primarily described with reference to a combination circuit that combines error masks after decompression, in some embodiments a circuit may be included to merge the compressed error masks prior to decompression. The merging may allow error masks to be combined to further reduce the amount of memory required by the buffer circuit. For example, with reference to FIG. 1, a circuit may be included to merge error masks output from FIFO buffers 122 and 124. This merging reduces the circuitry required to implement the decompression circuit (132 and 134), and the combination circuit 140. In another embodiment, a merging circuit may be provided to buffer compressed error masks output from compression sub-circuit 114 and merge the buffered data with the compressed error mask output from compression sub-circuit 112. The merged error mask may then be buffered in FIFO 124 and FIFO 126 may be removed completely.

Figure 4:
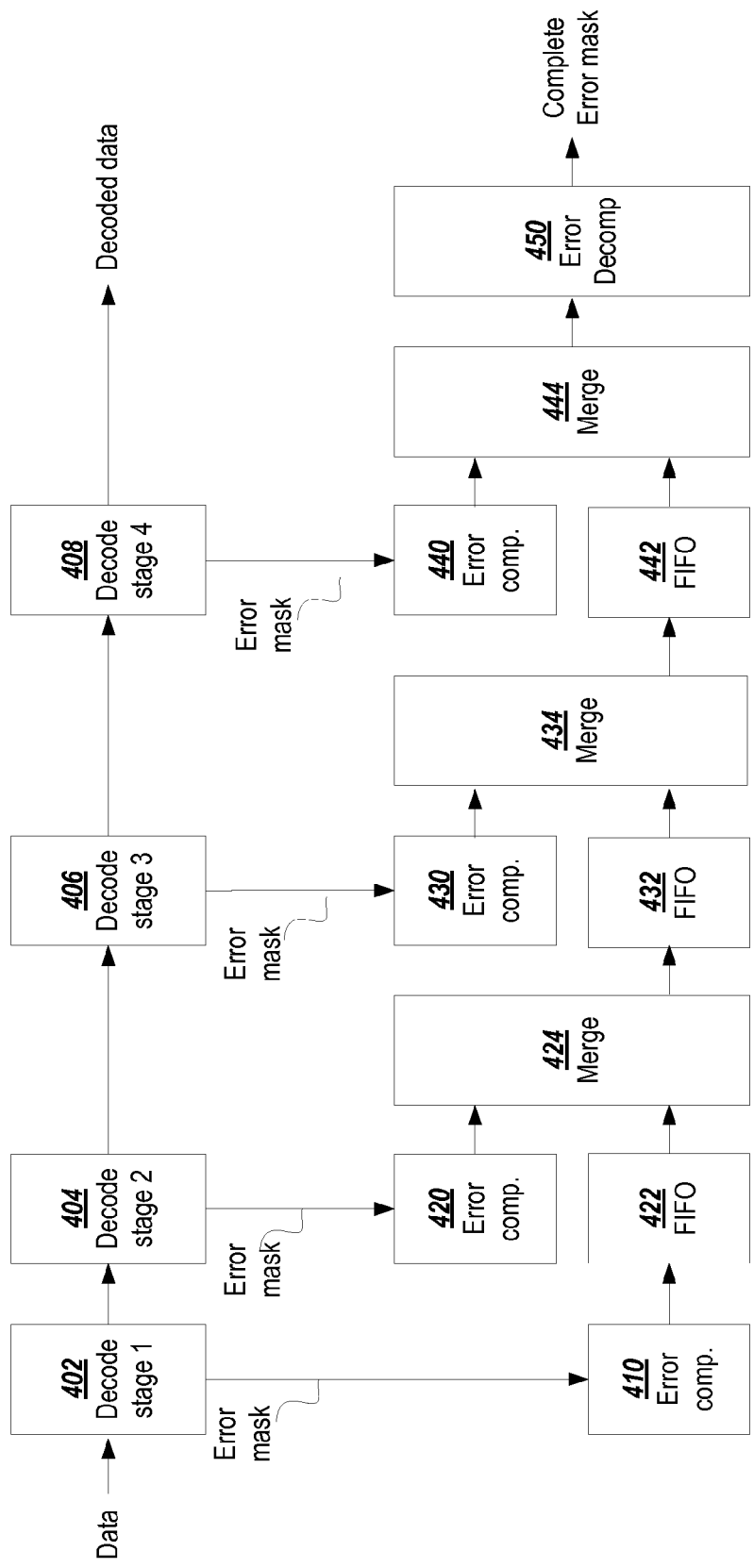
FIG. 4 shows a block diagram of a multi-stage decoder configured to merge compressed error masks prior to decompression in accordance with one or more embodiments.

FIG. 4 shows a block diagram of a multi-stage FEC decoder configured to merge compressed error masks prior to decompression in accordance with one or more embodiments. The FEC decoder in this example includes 4 pipeline-connected decoder stages (402, 404, 406, and 408). As described with reference to FIG. 1 above, each of the decoder stages is configured to generate an error mask indicating the location of each error corrected in the decoder stage. The error masks generated by each stage 402, 404, 406, and 408 are compressed by a respective compression circuit 410, 420, 430, and 440. The compressed mask output from the first compression circuit 410 is buffered in FIFO 422 while the error mask from stage 2 (404) is being compressed by compression circuit 420. The two compressed masks are merged with circuit 424 and stored in FIFO 432. For each decoding stage thereafter, the compressed error mask produced by the corresponding compression circuit (e.g., 430 and 440) is combined with the buffered merged error mask from the previous stage using another merge circuit (e.g., 434 and 444). After the last merge operation, the merged error mask is decompressed by decompression circuit 450 to produce the complete error mask of the multi-stage FEC decoder.

In some embodiments, not all error masks may be compressed. For example, as described with reference to FIG. 1, error masks produced by one or more later decoding stages may not be compressed and may be combined with error masks after decompression. For instance, a combination circuit may be added to follow the decompression circuit 450. The combination circuit is configured to combine the decompressed error mask produced by the decompression circuit 450 with the error masks produced by one or more of the later decoder stages, in which the error masks were not compressed. It is understood that other aspects of the discussed embodiments may similarly be combined in various combinations.

Figure 5:
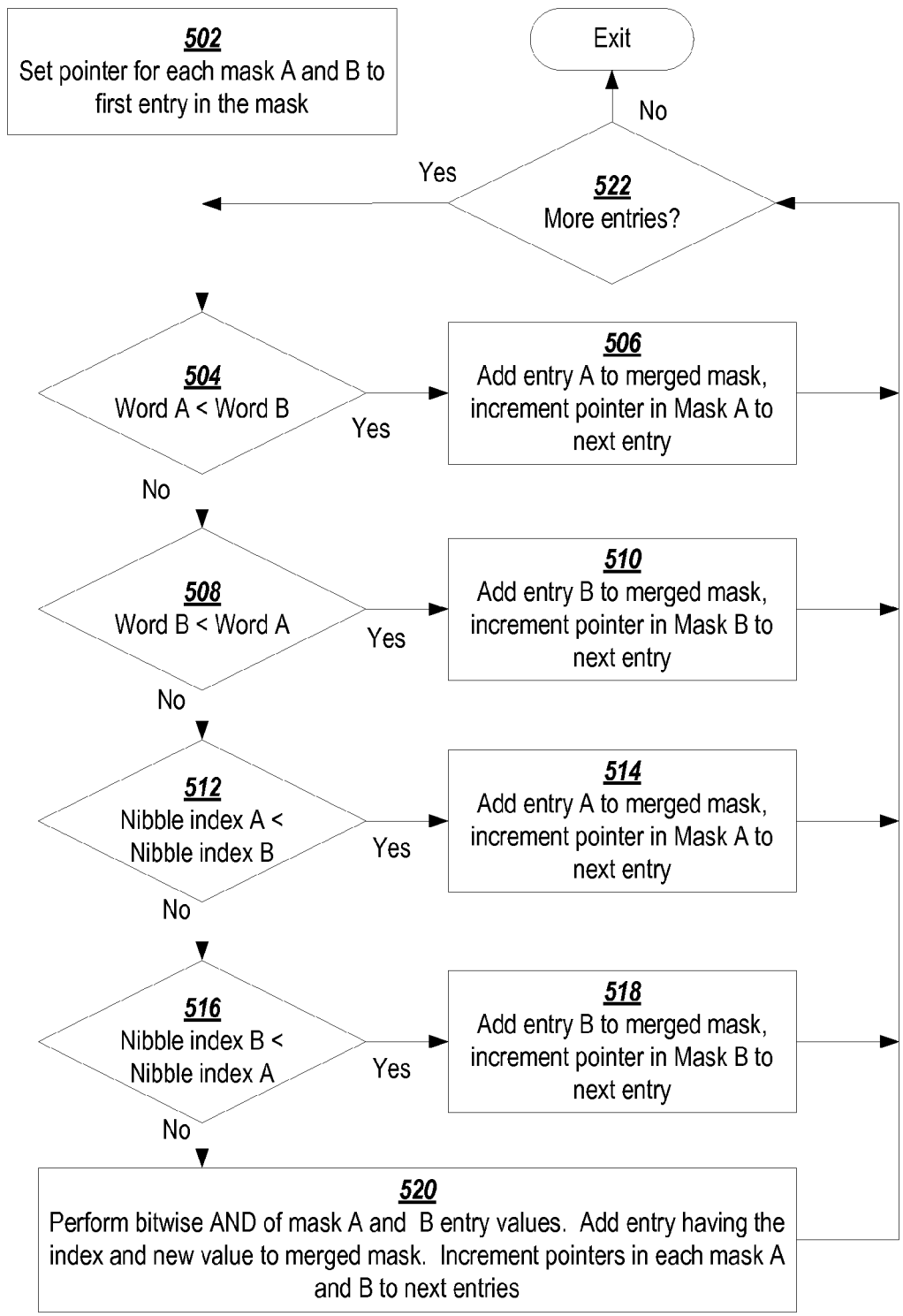
FIG. 5 shows a flowchart for merging two compressed error masks in accordance with one or more embodiments.

FIG. 5 shows a flowchart for merging two compressed error masks (A and B) in accordance with one or more embodiments. In this example the masks are compressed using the compression format shown in TABLE 1. The merged mask produced by this flow contains an entry for each word and nibble index included in either of the input masks A and B. If only one of the masks to be merged includes an entry for a particular word's nibble index, the entry in the merged mask will have the same nibble value as the entry in the original mask. The process performed in this example assumes that the entries in each of the compressed error masks are sorted from lowest to highest according to a word index, and sub-sorted from lowest to highest according to a nibble index.

A respective pointer for each mask A and B are set to point to the first entry in each mask at block 502. The entry of the masks A and B having the lowest index is determined at decision blocks 504, 508, 512, and 516. If word A is less than word B at decision block 504, the mask A entry has the lowest index. As a result, the entry of mask A is added to the merged mask, and the pointer of mask A is incremented to point to the next entry at block 506. If word B is less than word A at decision block 504, the mask B entry has the lowest index. As a result, the entry of mask B is added to the merged mask, and the pointer of mask A is incremented to point to the next entry at block 510.

Otherwise, word A and word B are equal, and the process compares nibble indexes at decision blocks 512 and 516 to determine which entry has the lowest index. If nibble index A is less than the nibble index B at decision block 512, the mask A entry has the lowest index. As a result, the entry of mask A is added to the merged mask, and the pointer of mask A is incremented to point to the next entry at block 514. If nibble index B is less than the nibble index A at decision block 516, the mask B entry has the lowest index. As a result, the entry of mask B is added to the merged mask, and the pointer of mask B is incremented to point to the next entry at block 518.

Otherwise, if nibble index B is not less than the nibble index A at decision block 516, the entry of mask A and the entry of mask B have the same word and nibble index. To merge the entries, a bitwise AND of the nibble values is performed at block 520 and an entry having the index and the resulting value is added to the merged mask. The pointers of both masks are incremented. The process repeats until no more entries are contained in either mask A or B at decision block 522.

Table 2 shows an example merging of two compressed error masks (Mask A and Mask B) using the flow shown in FIG. 5. For example, entries for indexes 0:1, 0:2, 0:3, and 1:0 (word:nibble index) are only included in respective ones of the original masks. Therefore, the nibble values of these entries will remain unchanged in the merged mask.

TABLE 2

| | Mask A | | | Mask B | | | Merged Mask | |
|---|---|---|---|---|---|---|---|---|
| Word | Nibble index | Nibble value | Word | Nibble index | Nibble value | Word | Nibble index | Nibble value |
| 0 | 1 | F | 0 | 3 | F | 0 | 1 | F |
| 0 | 2 | A | 0 | 4 | 8 | 0 | 2 | A |
| 0 | 4 | 1 | 2 | 3 | 6 | 0 | 3 | F |
| 1 | 0 | 2 | | | | 0 | 4 | 9 |
| 2 | 3 | 2 | | | | 1 | 0 | 2 |
| | | | | | | 2 | 3 | 4 |

Otherwise, for an index appearing in more than one of the masks to be merged, the nibble value for the index in the merged mask is a bitwise AND of each of the nibble values having the index in the masks to be merged. For example, indexes 0:4 and 2:3 each appear in the masks A and B to be combined in TABLE 2. The merged value at index 0:4 (i.e., 9) is equal to the bitwise AND of hexadecimal values 1 and 8. Similarly, the merged value at index 2:3 (i.e., 4) is the bitwise AND of hexadecimal values 2 and 6.

Figure 6:
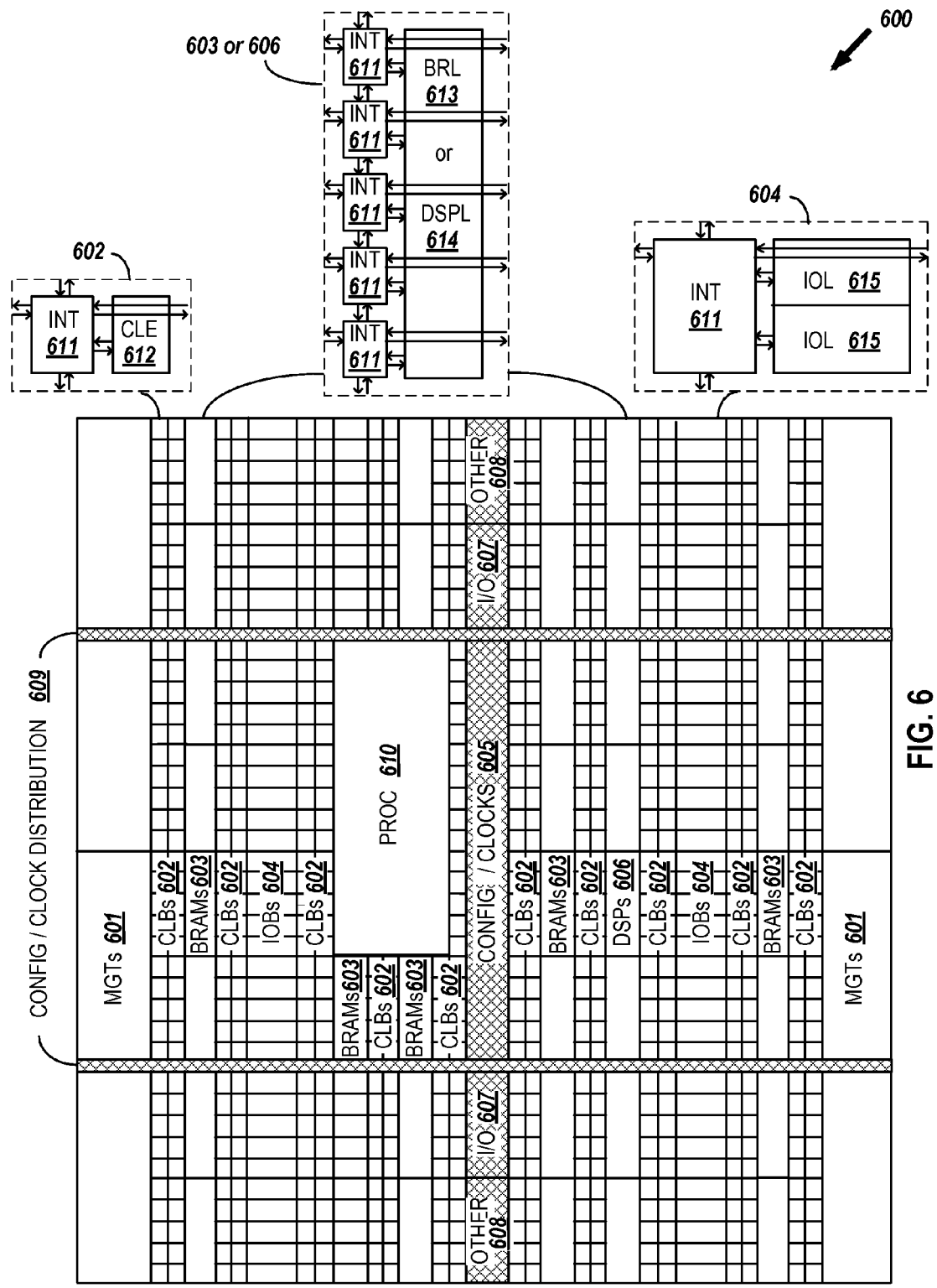
FIG. 6 shows a block diagram of an example programmable integrated circuit that may be used in implementing a multi-stage decoder in accordance with one or more embodiments.

FIG. 6 is a block diagram of an example programmable logic integrated circuit that may be used in implementing a decoder for forward error correction in accordance with one or more embodiments. A decoder for FEC, as previously described, may be implemented on the programmable logic and interconnect resources of a programmable integrated circuit. Programmable ICs can include several different types of programmable logic blocks in the array. For example, FIG. 6 illustrates a type of programmable IC known as a field programmable gate array (FPGA) (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, e.g., clock ports, and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

The embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), as a logic on a programmable logic device, or various combinations thereof. For example, some programmable ICs may include one or more computing processors in addition to programmable logic. Such ICs may be referred to as system-on-chip. Some embodiments may be implemented in a system-on-chip arrangement with some circuits of the multi-stage decoder being implemented using programmable or ASIC circuitry of the IC and other circuits of the multi-stage decoder being implemented using a computing processor implemented on the IC. It is intended that the specification and illustrated embodiments be considered as examples only, and the scope of the invention being indicated by the following claims.

What is claimed is:

1. A multi-stage decoder circuit, comprising:
a plurality of decoder stages, each configured to perform one or more decoding iterations and produce an error mask indicating each error detected in input data by the one or more decoding iterations;
a compression circuit coupled to one or more of the plurality of decoder stages and configured to generate, for each of one or more of the plurality of decoder stages, a respective compressed error mask from the error mask produced by the decoder stage;
a buffer circuit coupled to the compression circuit and configured to buffer the compressed error masks generated by the compression circuit;
a decompression circuit coupled to the buffer circuit and configured to decompress each of the compressed error masks into the error mask produced by the corresponding decoder stage; and
a combination circuit coupled to the decompression circuit and configured to combine the error masks generated by the decompression circuit into a single error mask.

2. The multi-stage decoder circuit of claim 1, wherein:
the plurality of decoder stages includes N decoder stages coupled in a pipeline;
the one or more of the plurality of decoder stages coupled to the compression circuit includes stages 1 through M in the pipeline, wherein M<N; and
the combination circuit is configured to combine the error masks from the decompression circuit with error masks generated by stages M+1 through N of the plurality stages in the pipeline.

3. The multi-stage decoder circuit of claim 2, wherein:
M is equal to N−2;
the buffer circuit is configured to buffer the compressed error masks generated by the compression circuit from the error masks from decoder stages 1 through M, and buffer the error mask generated by the (N−1)th decoder stage in the pipeline;
the decompression circuit is configured to decompress the buffered compressed error masks generated for decoder stages 1 through M into the error masks produced by the decoder stages 1 through M; and
the combination circuit is configured to combine the error masks output by the decompression circuit, the error mask produced by the (N−1)th decoder stage buffered in the buffer circuit, and the error mask produced by decoder stage N into the single error mask.

4. The multi-stage decoder circuit of claim 3, wherein the buffer circuit includes, for each decoder stage X of decoder stages 1 through M, for $1 \leq X \leq M$, a first-in-first-out (FIFO) buffer having storage for (N−1)-X of the compressed error masks generated by the compression circuit.

5. The multi-stage decoder circuit of claim 1, wherein the combination circuit is configured to perform an XOR of input error masks.

6. The multi-stage decoder circuit of claim 1, further comprising:
a statistics generator circuit coupled to an output of the combination circuit, the statistics generator circuit configured to:
determine a first number of errors, indicated by the single error mask, in which the correct value of the bit in error was 1; and
determine a second number of errors, indicated by the single error mask, in which the correct value of the bit in error was 0.

7. The multi-stage decoder circuit of claim 1, further comprising a statistics generator circuit coupled to an output of the combination circuit, the statistics generator circuit configured to determine a total number of errors corrected in the corrected data block.

8. The multi-stage decoder circuit of claim 7, wherein the statistics generator circuit is configured to determine the number of errors corrected for a plurality of respective sections of the corrected data block.

9. The multi-stage decoder circuit of claim 1, wherein the multistage decoder is configured to output the single error mask in parallel with a corrected data block output from the last stage of the plurality of decoder stages.

10. A method for multi-stage decoding, comprising:
decoding an FEC coded data block using a plurality of decoder stages, the plurality of decoder stages including N stages arranged in a pipeline circuit, and each stage of the N decoder stages performing one or more decoding iterations and generating an error mask that indicates each error found in performing the one or more iterations;
for each error mask generated by decoder stages 1 through M, wherein 1<M<N:
compressing the error mask into a compressed error mask;
buffering the compressed error mask; and
decompressing the buffered compressed error mask into a decompressed error mask equal to the error mask; and
combining the decompressed error masks and error mask generated by decoder stages M+1 through N into a single error mask.

11. The method of claim 10, wherein:
the compressing, buffering, and decompressing are performed for M=N−2 stages.

12. The method of claim 11, further comprising buffering the error mask generated by decoder stage M+1 in the pipeline circuit.

13. The method of claim 12, wherein the buffering of the error masks generated by decoder stages 1 through M includes:
for each decoder stage X, $1 \leq X \leq M$, buffering the error mask generated by the decoder stage in a first-in-first-out (FIFO) memory configured to store (N−1)-X error masks.

14. The method of claim 10, wherein the combining the decompressed error masks and the error masks generated by decoder stages M+1 through N into a single error mask, includes performing a bitwise XOR operation of two or more error masks.

15. The method of claim 10, further comprising:
determining a number of errors that have been corrected by the pipeline circuit.

16. The method of claim 15, wherein the determining of the number of errors includes:
determining a first number of errors, indicated by the single error mask, in which the correct value of the bit in error was 1; and
determining a second number of errors, indicated by the single error mask, in which the correct value of the bit in error was 0.

17. The method of claim 15, wherein the determining of the number of errors includes:
determining a first number of errors located in a first portion of the data block; and
determining a second number of errors located in a second portion of the data block.

18. A multi-stage decoder circuit, comprising:
a plurality of decoder stages, each decoder stage configured to perform one or more decoding iterations and produce an error mask indicating each error detected in input data by the one or more decoding iterations;
a compression circuit coupled to two or more decoder stages of the plurality of decoder stages and configured to generate, for each decoder stage of the two or more decoder stages, a respective compressed error mask from the error mask produced by the decoder stage;
a merge circuit configured to combine at least two of the two or more compressed error masks to produce a merged error mask; and
a decompression circuit coupled to the merge circuit and configured to decompress the merged error mask to produce a decompressed error mask.

19. The multi-stage decoder circuit of claim 18, wherein:
the compression circuit is configured to generate, for each decoder stage of at least three of the plurality of decoder stages, a respective compressed error mask from the error mask produced by the decoder stage; and
the merge circuit is configured to:
combine a first and a second of the three compressed error masks generated by the compression circuit to produce a first merged error mask; and
combine a third of the three compressed error masks generated by the compression circuit with the first merged error mask to produce a second merged error mask.

20. The multi-stage decoder circuit of claim 18, further comprising:
a combination circuit coupled to the decompression circuit and configured to combine the decompressed error mask with one or more of the error masks produced by the plurality of decoder stages to produce a single error mask indicating errors detected in the multi-stage decoder circuit.

* * * * *